United States Patent [19]

Matalone, Jr.

[11] 4,257,826

[45] Mar. 24, 1981

[54] PHOTORESIST MASKING IN MANUFACTURE OF SEMICONDUCTOR DEVICE

[75] Inventor: Samuel Matalone, Jr., Lubbock, Tex.

[73] Assignee: Texas Instruments Incorporated, Dallas, Tex.

[21] Appl. No.: 83,929

[22] Filed: Oct. 11, 1979

[51] Int. Cl.³ .......................................... H01L 21/26
[52] U.S. Cl. ...................................... 148/1.5; 148/187
[58] Field of Search .................... 148/1.5, 187; 29/571

[56] References Cited
U.S. PATENT DOCUMENTS

| | | | |
|---|---|---|---|
| 3,969,744 | 7/1976 | Nicholas et al. | 148/1.5 X |
| 4,021,270 | 3/1977 | Hunt et al. | 148/1.5 |
| 4,045,250 | 8/1977 | Dingwall | 148/1.5 |
| 4,046,606 | 9/1977 | Lambert | 148/187 X |
| 4,052,229 | 10/1977 | Pashley | 148/1.5 |
| 4,055,444 | 10/1977 | Rao | 148/187 X |
| 4,078,947 | 3/1978 | Johnson | 148/1.5 |
| 4,106,954 | 8/1978 | de Brebisson et al. | 148/1.5 |
| 4,131,983 | 1/1979 | Matzen | 148/1.5 X |
| 4,154,626 | 5/1979 | Joy et al. | 148/1.5 |
| 4,155,778 | 5/1979 | Antipov | 148/1.5 |

Primary Examiner—G. Ozaki
Attorney, Agent, or Firm—John G. Graham

[57] ABSTRACT

A semiconductor integrated circuit such as an MOS random access memory or RAM is made by standard N-channel silicon gate manufacturing methods but using positive photoresist for successive masking steps by re-exposure of the photoresist. In making ion implants for threshold adjustment, the positive photoresist is deposited and exposed using a first mask which defines the channel areas of transistors which are to have one threshold voltage; upon developing, the channel areas will be bare so a first implant will penetrate only these channel areas. Then, without stripping the photoresist, another exposure using a second mask defines the channel areas of transistors which are to have another threshold voltage. After the photoresist is developed a second time, another implant will penetrate the channel areas defined by the second mask as well as the first.

11 Claims, 2 Drawing Figures

PHOTORESIST MASKING IN MANUFACTURE OF SEMICONDUCTOR DEVICE

BACKGROUND OF THE INVENTION

This invention relates to semiconductor devices, and more particularly to methods of making N-channel silicon gate MOS random access memories and the like.

In the manufacture of semiconductor devices such as MOS/LSI dynamic RAMs, the methods used are generally of the type described in U.S. Pat. No. 4,055,444, issued to G. R. Mohan Rao, assigned to Texas Instruments, referred to as the N-channel self-aligned gate process. In this process ion implant steps are used to adjust the threshold voltages of MOS field effect transistors to two or more levels. The transistors in the cell array, for example, need to have different threshold voltages compared to transistors in the input/output buffers in the peripheral circuitry on the chip, where perhaps two different thresholds are needed. Heretofore, two or more separate mask steps were used for these ion implant steps, one for each implant. This required a cleaning or stripping operation then another spin-on deposition of photoresist. Since the costs, cycle times, and yields are dependent upon the number of process steps, it is preferable to reduce the number of operations when possible.

It is the principal object of this invention to provide an improved method of making semiconductor memory devices or the like, yet still using basically the standard high volume N-channel MOS process. Another object is to provide a semiconductor device which is made by the standard N-channel self-aligned silicon gate manufacturing process but with a reduced number of process steps.

SUMMARY OF THE INVENTION

In accordance with an embodiment of the invention, a semiconductor integrated circuit such as an MOS random access memory or RAM is made by standard N-channel silicon gate manufacturing methods but using positive photoresist for successive masking steps by re-exposure of the photoresist. In making ion implants for threshold adjustment, the positive photoresist is deposited and exposed using a first mask which defines the channel areas of transistors which are to have one threshold voltage; upon developing, the channel areas will be bare so a first implant will penetrate only these channel areas. Then, without stripping the photoresist, another exposure using a second mask defines the channel areas of transistors which are to have another threshold voltage. After the photoresist is developed a second time, another implant will penetrate the channel areas defined by the second mask as well as the first.

BRIEF DESCRIPTION OF THE DRAWINGS

The novel features believed chracteristic of the invention are set forth in the appended claims. The invention itself, however, as well as other features and advantages thereof, will be best understood by reference to the detailed description which follows, read in conjection with the accompanying drawings, wherein:

DETAILED DESCRIPTION OF SPECIFIC EMBODIMENT

Figure 1:
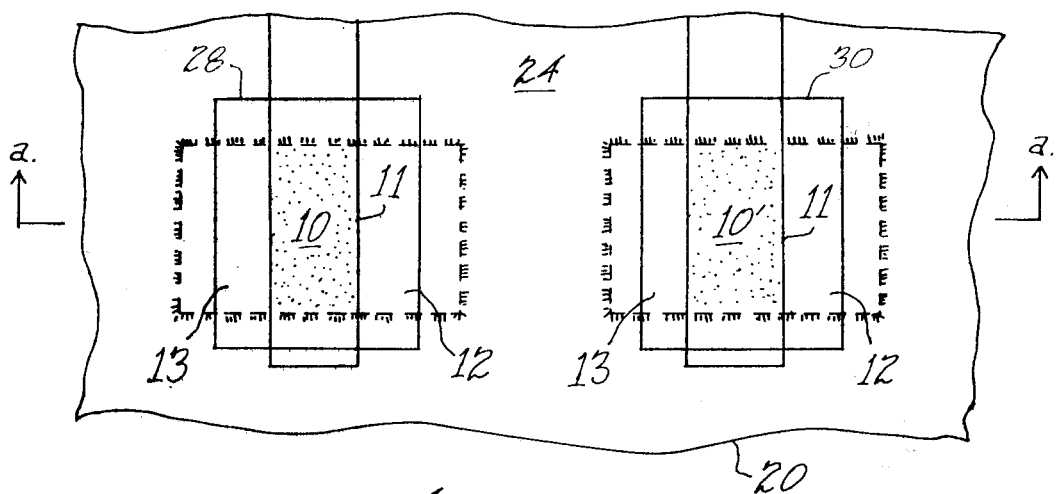
FIG. 1 is a greatly enlarged plan view of a small portion of a semiconductor chip showing the physical layout of transistors which may be made according to one embodiment of the invention.

With reference to FIG. 1, a part of a semiconductor device is illustrated which may be made according to one embodiment of the invention. The device includes MOS transistors 10 and 10', each having a gate 11, a source 12 and a drain 13. The gates 11 are actually parts of polysilicon strips which extend along the face of the semiconductor body. The device, formed on a silicon bar, would typically contain perhaps 64K memory cells, and the bar would be less than about 200 mils on a side or 40,000 sq. mil area depending upon the bit density. The transistors shown would be on a minute part of the bar, perhaps one or two mils wide. A "64K" RAM has 65,536 bits in an array, along with input/output circuitry, decoders and clock generators on the periphery.

Turning now to FIGS. 2a-2f, a process for making a semiconductor device according to the invention will be described. The starting material is a slice of P-type monocrystalline semiconductor grade silicon, typically four inches in diameter. In the FIGURES the portion shown of the bar 20 represents only a very small undivided part of the slice, perhaps one mil wide for each part. After appropriate cleaning, the slice is oxidized by exposing to oxygen in a tube furnace at an elevated temperature of perhaps 1000° or 1100° C. to produce an oxide layer 21 over the entire slice of a thickness of about 1000 Å. Next, a layer 22 of silicon nitride of about 1000 Å thickness is formed over the entire slice by exposing to an atmosphere of dichlorosilane and ammonia in a CVD reactor. A coating of photoresist is applied to the entire top surface of the slice, then exposed to ultraviolet light through a mask which defines the desired pattern of thick field oxide and P+ channel stop. The resist is developed, exposing areas where nitride is then etched away by a nitride etchant leaving in place the oxide layer 21.

Using photoresist and nitride as a mask, the slice is now subjected to a conventional ion implant step to produce the P+ channel stop regions whereby boron atoms are introduced into unmasked regions 23 of silicon. The regions 23 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

Figure 2:
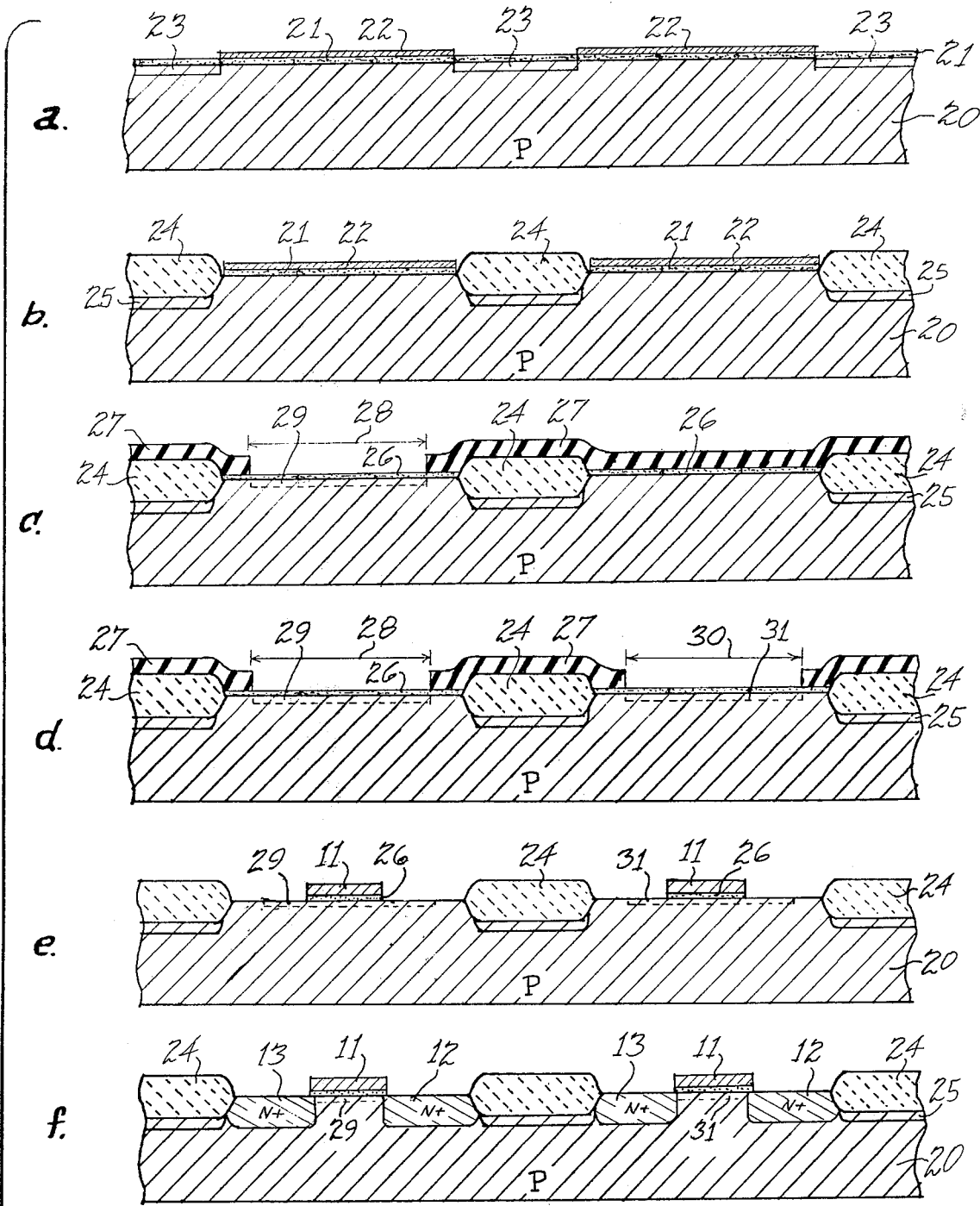
FIGS. 2a-2f are elevation views in section of the transistors in the semiconductor device of FIG. 1, at successive stages in the manufacturing process, taken generally along the line a—a in FIG. 1.

The next step in the process is formation of field oxide 24, which is done by subjecting the slices to steam or an oxidizing atmosphere at about 1000° to 1100° C. for perhaps several hours. This causes a thick field oxide region or layer 24 to be grown as seen in FIG. 2b. This region extends into the silicon surface because silicon is consumed as it oxidizes. The remaining parts of the nitride layer 22 mask oxidation. The thickness of this layer 24 is about 10,000 Å, about half of which is above the original surface and half below. The boron doped P+ regions 23 formed by implant will be partly consumed, but will also diffuse ahead of the oxidation front to form the P+ channel stop regions 25 under field oxide 24 much deeper than the original regions 23.

Next the remaining nitride layer 22 is removed by an etchant which attacks nitride but not silicon oxide, then the oxide 21 is removed by etching and the exposed silicon cleaned. Then gate oxide 26 is grown by thermal oxidation to a thickness of about 500 to 800 Å.

According to the invention, two ion implant steps are performed at this point using a single re-exposed coating of positive photoresist. Referring to FIG. 2c, a layer 27 of positive photoresist of a type commercially available is deposited on the face of the slice. The layer 27 is then exposed to ultraviolet light through a mask which allows light to pass through and impinge upon the area 28 above what is to be the channel region of the transistor 10. The positive photoresist is developed, which causes the layer 27 in the area 28 to wash away. An ion implant step is then performed using standard commercially-available equipment at energy levels and dosages commonly used for adjusting the threshold voltages in MOS devices, creating an implanted area 29. Next, the slice is re-exposed to ultraviolet light through a different mask which allows light to pass through and impinge upon an area 30 above what is to be the channel of the transistor 10', seen in FIG. 2d. Again, the photoresist is developed so the layer 27 in the area 30 washes away. A second ion implant step is performed at selected energy level and dosage to produce an implanted region 31 which will result in the desired threshold. At the same time, the region 29 in the area 28 is further implanted, so the combination of the two implants is selected to produce the desired threshold for the transistor 10. Next the layer 27 is stripped off.

The initial thickness of the layer 27 is about 12,500 Å, and about 1500 Å of this is removed by the first developing step. Upon re-exposing and re-developing about 2000 Å is removed, leaving about 9000 Å, a thickness sufficient to mask a 35 KeV implant.

As seen in FIG. 2e, windows in the oxide 26 for polysilicon to silicon contacts are patterned and etched at this point using a photoresist (not shown), then a layer of polycrystalline silicon of about 0.5 micron thickness is deposited over the entire slice in reactor using standard techniques. This layer is doped by the later N+ diffusion or implant to make it highly conductive. The polysilicon layer is patterned by applying another layer of photoresist, exposing to ultraviolet light through a mask prepared for this purpose, developing, then etching both polysilicon and exposed oxide. The remaining photoresist masks the gate areas (for a single-level polysilicon process) as well as the interconnections in other parts of the circuit on the chip. The unmasked polycrystalline silicon is etched away, so the resulting structure seen in FIG. 2e includes only part of the original polysilicon layer. The slice is next subjected to a standard N+ diffusion or implant, whereby the N+ source and drain regions are formed using the gate oxide 26 and the field oxide 24 as a diffusion mask.

A layer of silicon oxide is deposited by decomposition of silane at a low temperature, about 400° C. This layer insulates the metal level from the polycrystalline silicon interconnections and gates and is referred to as multilevel oxide. The multilevel oxide layer is patterned by a photoresist operation, exposing contact areas for a metal-to-silicon or metal-to-poly contacts in the RAM array or in the periphery of the chip in the input buffers, decoders, sense amplifiers, clock generators, and the like.

The metal contacts and interconnections are made in the usual manner by depositing a thin film of aluminum over the entire top surface of the slice then patterning it by a photoresist mask and etch sequence. This leaves metal strips, contact areas and bonding pads as needed.

A protective overcoat (not shown) is deposited and patterned to expose the bonding pads, then the slice is scribed and broken into individual chips or bars which are mounted in packages in the usual manner.

Instead of a single-level polysilicon process which has been described, a double-level polysilicon process is usually preferred for very dense RAM arrays, but this selection is not pertinent to the invention.

The concept of the invention could be used in other successive process operations instead of implants as described above. For example, successive etches of different layers may employ the re-exposure of positive photoresist as described.

Instead of exposure to ultraviolet light as mentioned herein, it is apparent that the same principles are applicable to lithography using electron beam, X-ray, or other types of radiation.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a semiconductor device including transistors comprising the steps of applying a layer of photosensitive masking material on a face of a semiconductor body, exposing first areas of said layer to radiation, developing the layer to remove said first areas, performing a processing operation including ion implant on said face using the remaining layer as a mask, exposing second areas of the layer to radiation, developing the layer to remove the second areas, and performing another processing operation including ion implant on said face using the remaining layer as a mask.

2. A method according to claim 1 wherein the photosensitive masking material is positive photoresist.

3. A method according to claim 2 wherein the radiation is ultraviolet light.

4. A method of making a semiconductor device wherein the semiconductor device includes transistors, comprising the steps of applying a layer of photosensitive masking material on a face of a semiconductor body, exposing first areas of said layer to radiation, developing the layer to remove said face using the remaining layer as a mask, exposing second areas of the layer to radiation, developing the layer to remove the second areas, and performing another processing operation on said face using the remaining layer as a mask, the processing operations being ion implants which adjust the threshold voltages of such transistors.

5. A method according to claim 4 wherein the semiconductor body is P-type silicon, and sources and drains of the transistors are N-type.

6. A method according to claim 4 wherein the photosensitive masking material is positive photoresist.

7. A method according to claim 6 wherein the radiation is ultraviolet light.

8. A method of making a semiconductor device comprising the steps of applying a layer of photosensitive masking material on a face of a semiconductor body, exposing first areas of said layer to radiation, developing the layer to remove said first areas, altering said face at said first areas using the remaining layer as a mask by a processing operation, exposing second areas of the layer to radiation, developing the layer to remove the second areas, and altering said face at said second areas using the remaining layer as a mask by another processing operation.

9. A method according to claim 8, wherein the semiconductor device includes transistors, and the processing operations are ion implants which adjust the threshold voltages of such transistors.

10. A method according to claim 8 wherein the photosensitive masking material is positive photoresist.

11. A method according to claim 10 wherein the radiation is ultraviolet light.

* * * * *